United States Patent
Schneider

(10) Patent No.: US 11,408,756 B2
(45) Date of Patent: Aug. 9, 2022

(54) MAGNETIC POSITION MEASURING DEVICE

(71) Applicant: DR. JOHANNES HEIDENHAIN GmbH, Traunreut (DE)

(72) Inventor: Johannes Schneider, Traunstein (DE)

(73) Assignee: DR. JOHANNES HEIDENHAIN GMBH, Traunreut (DE)

( * ) Notice: Subject to any disclaimer, the term of this patent is extended or adjusted under 35 U.S.C. 154(b) by 0 days.

(21) Appl. No.: 17/242,549

(22) Filed: Apr. 28, 2021

(65) Prior Publication Data

US 2021/0348951 A1 Nov. 11, 2021

(30) Foreign Application Priority Data

May 6, 2020 (EP) ..................... 20173118

(51) Int. Cl.
*G01D 5/245* (2006.01)
(52) U.S. Cl.
CPC .................... *G01D 5/245* (2013.01)
(58) Field of Classification Search
CPC .............. G01R 33/06–098; G01D 5/12–2525
See application file for complete search history.

(56) References Cited

U.S. PATENT DOCUMENTS

| | | | | |
|---|---|---|---|---|
| 5,216,363 A * | 6/1993 | Masaaki | ................ | G01D 5/145 324/207.21 |
| 5,243,280 A * | 9/1993 | Kusumi | ................ | G01B 7/003 324/252 |
| 5,422,569 A * | 6/1995 | Nakahara | ................ | G01P 3/487 310/68 B |
| 9,464,919 B2 * | 10/2016 | Sugino | ................ | G01D 5/20 |
| 9,772,198 B2 * | 9/2017 | Shimizu | ................ | G01R 25/005 |
| 2013/0082699 A1 * | 4/2013 | Fu | ................ | G01R 33/09 324/252 |
| 2015/0253162 A1 * | 9/2015 | Kusumi | ................ | G01R 33/098 324/207.12 |

FOREIGN PATENT DOCUMENTS

| | | | |
|---|---|---|---|
| EP | 0235750 A2 | | 9/1987 |
| JP | 10185507 A | * | 7/1998 |
| JP | H10185507 A | | 7/1998 |
| WO | 2011/136054 A1 | | 11/2011 |

OTHER PUBLICATIONS

European Search Report issued in corresponding EP Application No. 20173118.9, dated Oct. 5, 2020, pp. 1-2.

* cited by examiner

*Primary Examiner* — Huy Q Phan
*Assistant Examiner* — David B Frederiksen
(74) *Attorney, Agent, or Firm* — Carter, DeLuca & Farrell LLP

(57) ABSTRACT

A magnetic position measuring device includes a magnetic scale and a scanning unit movable relative thereto in at least one measuring direction. The magnetic scale has scale regions positioned at a regular pitch and have an oppositely oriented magnetization, the pitch indicating the extension of a scale region along the measuring direction. The scanning unit has at least one first detector unit cell, which includes three stripe-shaped magnetoresistive detector elements set apart from one another in the measuring direction, the longitudinal directions of the detector elements each having an orientation oriented perpendicular to the measuring direction. Adjacent detector elements along the measuring direction in the first detector unit cell have a distance of, for example, one twelfth of the pitch, relative to one another.

23 Claims, 6 Drawing Sheets

MAGNETIC POSITION MEASURING DEVICE

CROSS-REFERENCE TO RELATED APPLICATIONS

The present application claims priority to Application No. 20173118.9, filed in the European Patent Office on May 6, 2020, which is expressly incorporated herein in its entirety by reference thereto.

FIELD OF THE INVENTION

The present invention relates to a magnetic position measuring device, which is, for example, suitable for measuring the position of two objects arranged along at least one measuring direction so as to be movable relative to each other.

BACKGROUND INFORMATION

Generally, magnetic position measuring devices have a magnetic scale, which includes scale regions having a different magnetization that are arranged in alternation at a pitch P, and a scanning unit movable in relation thereto in at least one measuring direction. Pitch P indicates the extension of a scale region along the measuring direction. Provided on the side of the scanning unit is, for example, a detector system having suitable detector elements that are sensitive to a magnetic field. Magnetoresistive, thin layers arranged in the form of stripes may be used as detector elements, e.g., Permalloy layers having an anisotropic magnetoresistance. This means that the electrical resistivity in the detector element changes in the presence of an external magnetic field. The resistivity change resulting in the detector elements is a function of the external magnetic field, and as the magnetic field strengthens, the characteristic curves of such detector elements experience distortions. The distortions of the characteristic curve also cause distortions in the output signals of the detector elements as a function of the amplitudes of the scale-magnetic field so that the accuracy of the position measurement is adversely affected. Hereinafter, such distortions are referred to as harmonics or harmonic waves of the fundamental frequency of the measuring signal resulting from pitch P of the scale.

A variety of solutions for removing such harmonic waves in magnetic position measuring devices are conventional. Generally, a certain geometric positioning of the detector elements as a function of the harmonic wave to be filtered is provided in the scanning-side detector system.

To filter the undesired third harmonic, Japanese Patent Document No. 10-185507, for example, describes a certain configuration of a detector unit cell in the detector system, which includes three stripe-shaped magnetoresistive detector elements that are set apart from one another in the measuring direction. The longitudinal directions of the detector elements are oriented perpendicular to the measuring direction in each case. Adjacent detector elements have a distance of P/8 along the measuring direction, P indicating the pitch of the scale regions featuring an opposite magnetization. The center detector element of the detector unit cell, having the length L1, has a greater length than the two outer detector elements, which have length L2 in each case. Length L2 of the outer detector elements is selected to be $L2=L1/\sqrt{2}$ in each case. Set apart along the measuring direction is a second, identically configured detector unit cell, which forms a first detector block together with the first detector unit cell. A first periodic incremental signal is generated with the aid of the first detector block. Via a second detector block, a second periodic incremental signal is generated, which has a 90° phase offset in relation to the first incremental signal. The second detector block is arranged perpendicular to the measuring direction at an offset in relation to the first detector block by an amount that is greater than length L1.

This filter configuration is arranged to filter only the third harmonic from the measuring signals. In some instances, however, the measuring signals include even higher harmonics that are to be removed.

Additionally, the offset of the detector blocks required perpendicular to the stripe direction for the generation of the first and the second incremental signals is not advantageous. For example, if inhomogeneities are present in the material composition in the scale, then the amplitudes of the first and the second incremental signals differ locally, which results in an inaccurate position detection.

SUMMARY

Example embodiments of the present invention provide a highly precise magnetic position measuring device that allows for effective filtering of multiple undesired harmonics from the output signals. An improved filter effect should be ensured via the most compact extension of the detector system, even if inhomogeneities are present in the scanned scale.

According to an example embodiment of the present invention, a magnetic position measuring device includes a magnetic scale and a scanning unit movable thereto in at least one measuring direction. The magnetic scale has scale regions positioned at a regular pitch P and have an oppositely oriented magnetization, pitch P indicating the extension of a scale region along the measuring direction. The scanning unit includes at least one first detector unit cell, which includes three stripe-shaped magnetoresistive detector elements set apart from one another in the measuring direction, the longitudinal directions of the detector elements having an orientation perpendicular to the measuring direction in each case. Adjacent detector elements along the measuring direction in the first detector unit cell have a distance DX=P/12 from one another.

The center detector element may have a length $L_b$ along its longitudinal direction, which is greater than the lengths $L_a$, $L_c$ of the two outer detector elements.

the two outer detector elements may have a detector element length $L_a=L_c=L_b/\sqrt{3}$.

It may be provided that the scanning unit has at least one first detector block, which includes the first detector unit cell and a second detector unit cell, arranged identically to the first detector unit cell. The second detector unit cell is arranged along the measuring direction at an offset by measuring-direction offset amount $V\_DE_x=P/6$ in relation to the first detector unit cell. Additionally, the second detector unit cell, perpendicular to the measuring direction, is arranged at an offset by transverse offset amount $V\_DE_y=L_b+\Delta 1$ in relation to the first detector unit cell, so that the first detector block has a detector block length $L\_DB_y=2\cdot L_b+\Delta 1$ along the longitudinal direction of the detector elements, with $\Delta 1$ being between 10 μm and 100 μm.

In addition, the scanning unit may also have a second detector block, which has an identical configuration to the first detector block, the first and the second detector block jointly forming a first detector group. The second detector block is arranged along the measuring direction at an offset of measuring direction offset amount $V\_DB_x=P/22$ in relation to the first detector block. The second detector block, perpendicular to the measuring direction, is arranged at an offset by transverse offset amount $V\_DB_y=L\_DB_y+\Delta 2$ in relation to the first detector block, with $\Delta 2$ being between 10 µm and 100 µm.

In addition, the detector elements of the first detector group may be connected to one another in series so that a first periodic partial incremental signal is able to be generated via the first detector group in a relative movement of the scale and the scanning unit.

Moreover, it may be provided that the scanning unit has at least three further detector groups, each having an identical configuration to the first detector group. A second detector group is arranged along the measuring direction at a distance GX=P/4 from the first detector group so that a second periodic partial incremental signal, which has a 90° phase offset in relation to the first partial incremental signal, is able to be generated via the second detector group in case of a relative movement of the scale and the scanning unit. A third detector group is arranged along the measuring direction at a distance GX=P/4 from the second detector group so that a third periodic partial incremental signal, which has a 90° phase offset in relation to the second partial incremental signal, is able to be generated via the third detector group in case of a relative movement of the scale and the scanning unit. A fourth detector group is arranged along the measuring direction at a distance GX=P/4 from the third detector group so that a fourth periodic partial incremental signal, which has a phase offset of 90° in relation to the third partial incremental signal, is able to be generated via the fourth detector group in the case of relative movement of the scale and the scanning unit.

In this context it is possible that the first and the third detector group are connected to each other such that a first periodic incremental signal is able to be generated from the first and the third partial incremental signal, and the second and the fourth detector group are connected to each other such that a second periodic incremental signal, which has a 90° phase offset in relation to the first incremental signal, is able to be generated from the second and the fourth partial incremental signal.

It may furthermore be provided that the scanning unit has at least one first detector block, which includes the first detector unit cell and a second detector unit cell, the second detector unit cell being arranged along the measuring direction at an offset by measuring-direction offset amount $V\_DE_x=P/6$ in relation to the first detector unit cell, and one detector element is part both of the first and the second detector unit cell so that the first detector block includes five detector elements.

In this context, it is possible that the center detector elements of the two detector unit cells have the same length $L_b=L_b'$ in each case, the outermost detector elements of the two detector unit cells have the same length $L_a=L_a'$ in each case, and the detector element that is part of both the first and the second detector unit cell has a detector element length $L_3=2\cdot L_a=2\cdot L_b/\sqrt{3}$ along its longitudinal direction.

The first detector block may have a detector block length $L\_DB_y'=2\cdot L_b+\Delta 1'$ along the longitudinal direction of the detector elements, with $\Delta 1'$ being between 10 µm and 100 µm.

In this context, it may be provided that the detector element that is part of both the first and the second detector unit cell is arranged in symmetry with a center line of symmetry of the first detector block, the two further detector elements of the first detector unit cell are set apart within the range of between $\Delta 1'/2$ and $L\_DB_y'/2$ and arranged on one side of the line of symmetry, and the two further detector elements of the second detector unit cell are set apart within the range of between $\Delta 1'/2$ and $L\_DB_y'/2$ on the opposite side of the line of symmetry.

In addition, the scanning unit may also have a second detector block, which has an identical configuration to that of the first detector block, the first and the second detector block jointly forming a first detector group. The second detector block is arranged along the measuring direction at an offset by the measuring-direction offset amount $V\_DB_x'=P/22$ in relation to the first detector block, and, perpendicular to the measuring direction, is arranged at an offset by the transverse offset amount $V\_DB_y=L\_DBy'+\Delta 2'$ in relation to the first detector block, with $\Delta 2'$ being between 10 µm and 100 µm.

The detector elements of a detector group may be interconnected in series.

In addition, it may be provided that the detector elements are arranged as anisotropic magnetoresistive sensors.

Based on the configuration of a first detector unit cell, it is possible to provide a device in the magnetic position measuring device hereof that also ensures filtering or a suppression of multiple undesired harmonics in the output signals, e.g., the simultaneous filtering of the third, fifth, seventh, ninth, and eleventh harmonics. This may furthermore be achieved by an extremely compact spatial extension of the structures in the scanning-side detector system required for this purpose. In this manner, the effect of possible scale inhomogeneities on the desired filtering effect is able to be considerably reduced.

Further features and aspects of example embodiments of the present invention are described in greater detail below with reference to the appended Figures.

DETAILED DESCRIPTION

Figure 1:
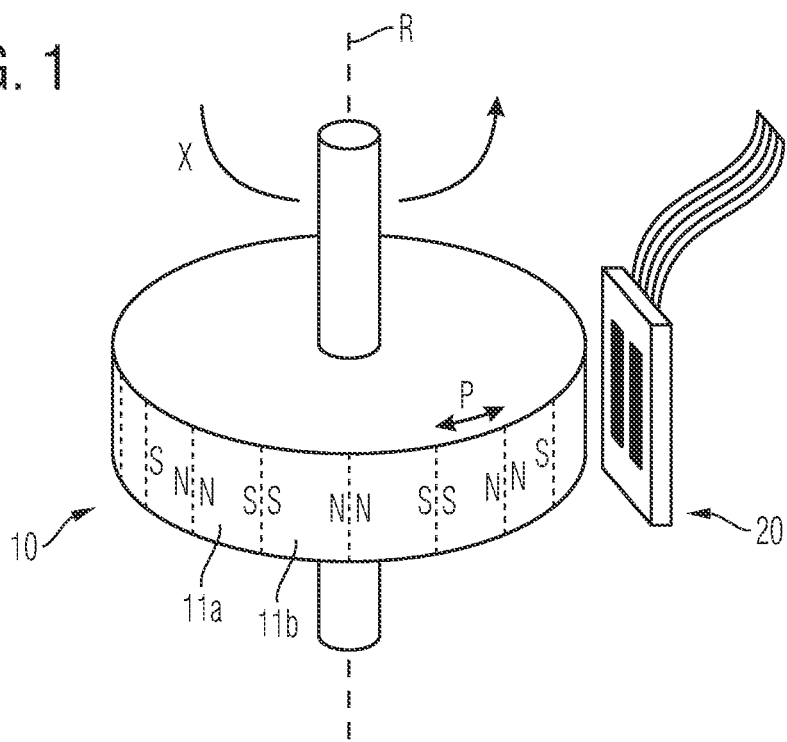
FIG. 1 schematically illustrates a magnetic position measuring device, suitable for acquiring relative rotational movements, according to an example embodiment of the present invention.
Figure 2:
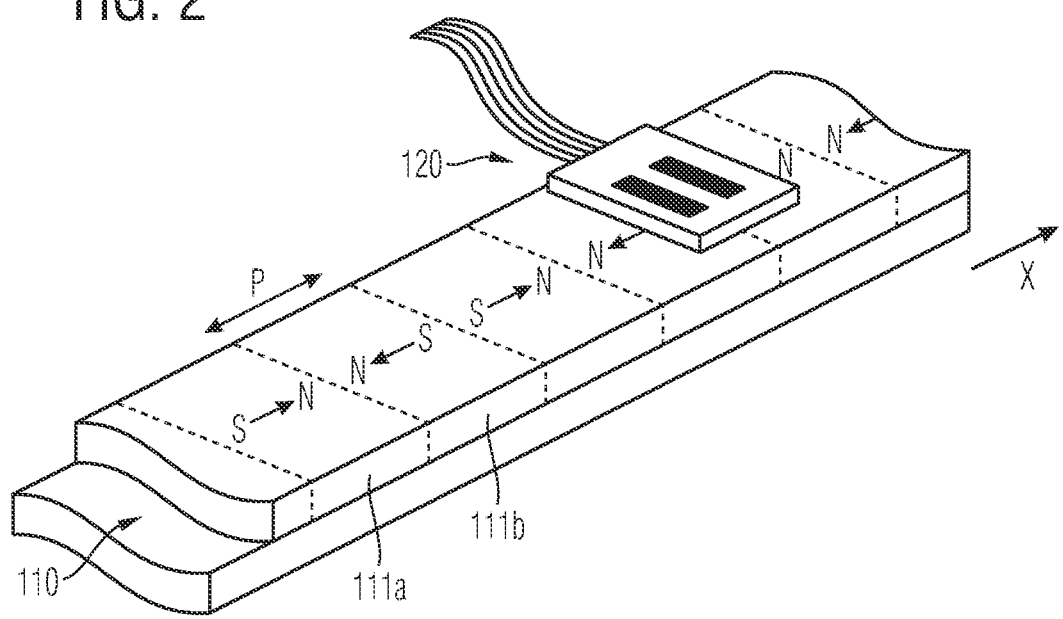
FIG. 2 schematically illustrates a magnetic position measuring device, suitable for acquiring linear relative movements, according to an example embodiment of the present invention.

FIGS. 1 and 2 schematically illustrate magnetic position measuring devices according to example embodiments of the present invention.

The variant illustrated in FIG. 1 is used for detecting the relative position of two objects that are arranged so as to allow for a rotational movement relative to each other about an axis of rotation R. A first object is connected to magnetic scale 10 of the magnetic position measuring device, and a second object is connected to scanning unit 20 of the position measuring device. Scale 10 and scanning unit 20 are able to move relative to each other along measuring direction x about axis of rotation R, measuring direction x extending along a circular ring around axis of rotation R.

For example, the objects connected to scale 10 and scanning unit 20 may be two machine components which are capable of moving relative to each other about axis of rotation R and whose relative position is to be detected with the aid of the magnetic position measuring device. For this purpose, the position measuring device generates position-dependent scanning signals in the form of periodic incremental signals, which are able to be further processed by sequential electronics.

Magnetic scale 10 has scale regions 11a, 11b featuring an oppositely oriented magnetization, arranged at regular pitch P along measuring direction x on the outer circumferential surface of a drum-shaped carrier body. The drum-shaped carrier body is arranged so as to be rotatable about axis of rotation R. Pitch P indicates the extension of a scale region 11a, 11b along measuring direction x. Both scale regions 11a and scale regions 11b thus have an identical extension along measuring direction x. As illustrated FIG. 1, scale regions 11a, 11b are arranged so that adjacent scale regions 11a, 11b in the boundary region have an oppositely oriented magnetization or the same magnetic poles. In adjacent scale regions 11a, 11b, magnetic north or south poles are always arranged opposite each other. Scale periodicity λ in a scale 10 provided in this manner thus results according to the relationship: $\lambda = 2 \cdot P$.

Via scale 10, a periodically modulated magnetic field is thus generated along measuring direction x adjacent to scale 10, which is scanned by scanning unit 20. The pitch P of scale regions 11a, 11b may, for example, be 395 μm.

Arranged on the side of scanning unit 20 is a detector system having multiple magnetoresistive detector elements for generating position-dependent scanning signals or incremental signals. It should be appreciated that the detector system is only schematically illustrated in FIG. 1 and is described in greater detail below. Scanning unit 20 is, for example, fixedly arranged in relation to the rotating, drum-shaped carrier body having scale 10.

Anisotropic magnetoresistive sensors, which are also referred to as AMR sensors, may be provided as magnetoresistive detector elements in scanning unit 20. They include thin layers arranged in the form of stripes and made from an NiFe alloy, such as Permalloy, whose electric resistance changes in the presence of an external magnetic field. Because of the periodically modulated magnetic field of the scale, it is therefore possible in a relative movement of scale 10 and scanning unit 20 to generate position-dependent periodic scanning signals via the detector system of scanning unit 20, the scanning signals having a signal period SP=P.

The scanning signals generated with the aid of the magnetic position measuring device are transmitted to sequential electronics, which further processes the scanning signals depending on the application. For example, this may involve a higher-level machine control which controls the relative movement of the two machine components that are movable relative to each other.

A second variant of a magnetic position measuring device is schematically illustrated in FIG. 2 and is used for detecting the relative position of two objects arranged so as to be displaceable relative to each other along linear measuring direction x. A first object is connected to magnetic scale 110 of the magnetic position measuring device, and a second object is connected to scanning unit 120 of the position measuring device.

In this instance, scale 110 extends along linear measuring direction x and also has scale regions 111a, 111b of an oppositely oriented magnetization. Similar to the rotatory variant, scale regions 111a, 111b are arranged at a regular pitch P along measuring direction x on a suitable carrier body.

Suitable variants of scanning unit 120 of the magnetic position measuring device are described in greater detail below with reference to FIGS. 3 to 6. It should be appreciated that these variants may be used both in rotatory and linear configurations of the magnetic position measuring device.

Figure 3:
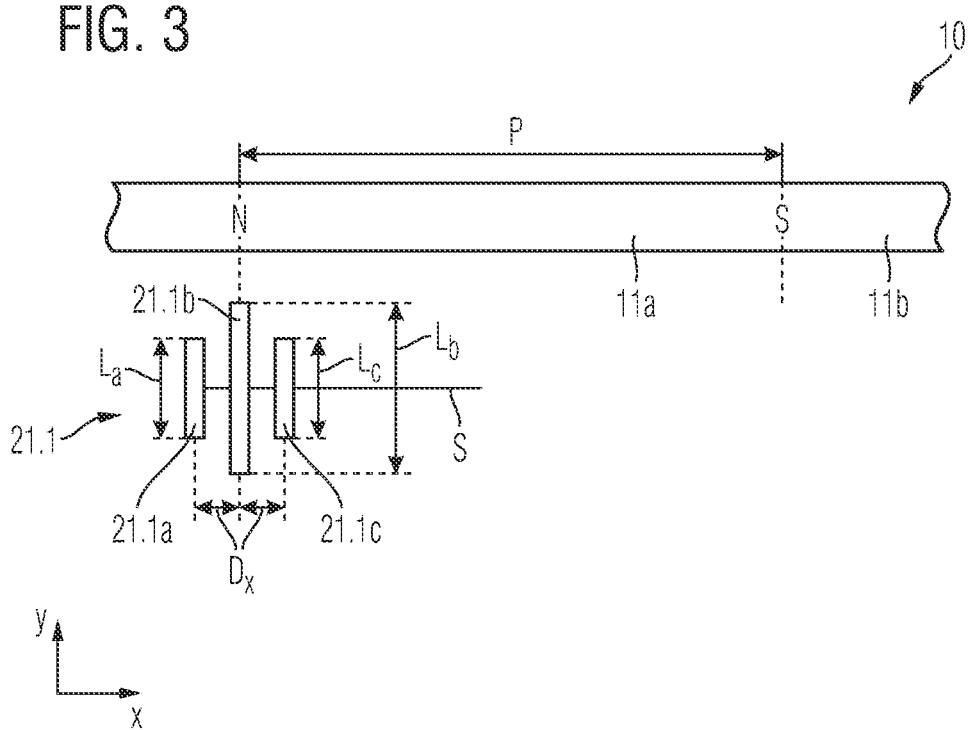
FIG. 3 schematically illustrates the configuration of a detector unit cell in a scanning unit of the magnetic position measuring device.

FIG. 3 is a schematic top view of a first detector unit cell 21.1 in the detector system of a scanning unit, which is adjacent to a section of magnetic scale 10 which is scanned thereby. Detector unit cell 21.1 includes three stripe-shaped magnetoresistive detector elements 21.1a, 21.1b, 21.1c, which are arranged at a distance from one another in measuring direction x. Detector elements 21.1a to 21.1c have a rectangular configuration and their longitudinal directions y oriented in parallel extend perpendicular to measuring direction x in each case.

Distance $D_x$ provided between adjacent detector elements 21.1a to 21.1c along measuring direction x is selected as a function of pitch P of scale regions 11a, 11b on scale 10 and amounts to, for example, $D_x = P/12$.

As illustrated in FIG. 3, along its longitudinal direction y, center detector element 21.1b has a length $L_b$ that is selected to be greater than lengths $L_a$, $L_c$ of the two outer detector elements 21.1a, 21.1c. Lengths $L_a$, $L_c$ of the two outer detector elements 21.1a, 21.1c are selected to be identical and have lengths of, for example, $L_a = L_c = L_b / \sqrt{3}$ in each case.

For example, with a pitch P=395 μm, length $L_b$ of center detector element 21.1b is selected according to $L_b = 80$ μm, so that the result for lengths $L_a$, $L_c$ of the two outer detector elements 21.1a, 21.1c amounts to $L_a = L_c = 46.19$ μm according to the previously mentioned relationships.

This configuration of first detector unit cell 21.1 results in a defined filter effect on the harmonics included in the periodic scanning signals. Using a detector unit cell 21.1 arranged in this manner, the fifth and seventh harmonics resulting in the case of a relative movement between scale 10 and the scanning unit during the scanning of magnetic scale 10 are able to be filtered out of the scanning signals.

In this example of a first detector unit cell 21.1, it is basically not mandatory for the two outer detector elements 21.1a, 21.1c to be placed in a centered fashion in relation to a line of symmetry S of center detector element 21.1b, as provided in the example illustrated in FIG. 3. As an alternative, it is also possible that these detector elements 21.1a, 21.1c are shifted along their longitudinal direction y and are arranged in a range predefined by length $L_b$ of center detector element 21.1b.

In order to remove still further harmonics from the scanning signals, in addition to the fifth and seventh harmonics, the detector system including first detector unit cell 21.1 in the scanning unit is able to be appropriately modified or expanded. One possibility for the additional filtering of the third and the ninth harmonics is described below with reference to FIG. 4.

Figure 4:
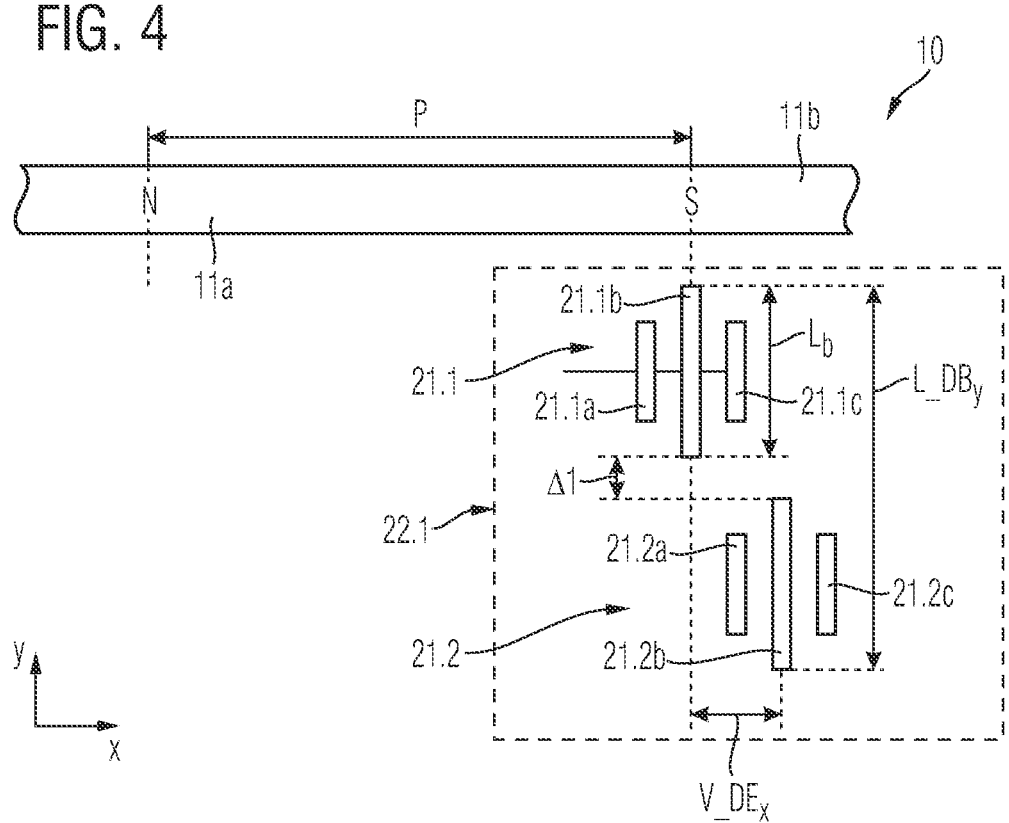
FIG. 4 schematically illustrates the configuration of a detector block unit cell in a scanning unit of the magnetic position measuring device.

As schematically illustrated in FIG. 4, the detector system in the scanning unit not only includes first detector unit cell 21.1 but also a second detector unit cell 21.2. Second detector unit cell 21.2 is substantially identical in its configuration to first detector unit cell 21.1, and—similar to first detector unit cell 21.1—thus also includes three detector elements 21.2a to 21.2c, whose lengths along direction y as well as their mutual relative positioning along the measuring direction are selected to be similar to that of first detector unit cell 21.1.

Second detector unit cell 21.2 is arranged in a certain relative position with respect to first detector unit cell 21.1 in the detector system. For example, second detector unit cell 21.2 is arranged along measuring direction x at an offset by measuring-direction offset amount $V\_DE_x=P/6$ in relation to first detector unit cell 21.1. In addition, it is provided that second detector unit cell 21.2 is arranged perpendicular to measuring direction x, i.e., along the y-direction, by an offset of transverse offset amount $V\_DE_y=L_b+\Delta1$ relative to first detector unit cell 21.1. Variable $\Delta1$ is, for example, in the range between 10 µm and 100 µm.

Thus, a first detector block 22.1 is arranged via the two detector unit cells 21.1, 21.2. Along longitudinal direction y of detector elements 21.1a to 21.1c, 21.2a to 21.2c, first detector block 22.1 has a detector block length of, e.g., $L\_DB_y=2 \cdot L_b+\Delta1$.

If variable $\Delta1$ is selected to be approximately $\Delta1=80$ µm, for example, then a detector block length $L\_DB_y=240$ µm along the y-direction results with $L_b=80$ µm. This therefore allows for the filtering of undesired harmonics from the generated scanning signals with the aid of a detector system that has a very compact configuration along the y-direction. If typical extensions of possible scale inhomogeneities are present in the order of magnitude of approximately 300 µm, then a detector system arranged in this manner is able to considerably reduce the effect of possible scale inhomogeneities on the desired filter effect.

If in addition to the third, fifth, and ninth harmonics, the eleventh harmonic is to be filtered out of the scanning signals as well, then the detector system including first detector block 22.1 illustrated in FIG. 4 may be expanded even further in the scanning unit. One option for the additional filtering of the eleventh harmonic is described below with reference to FIG. 5.

Figure 5:
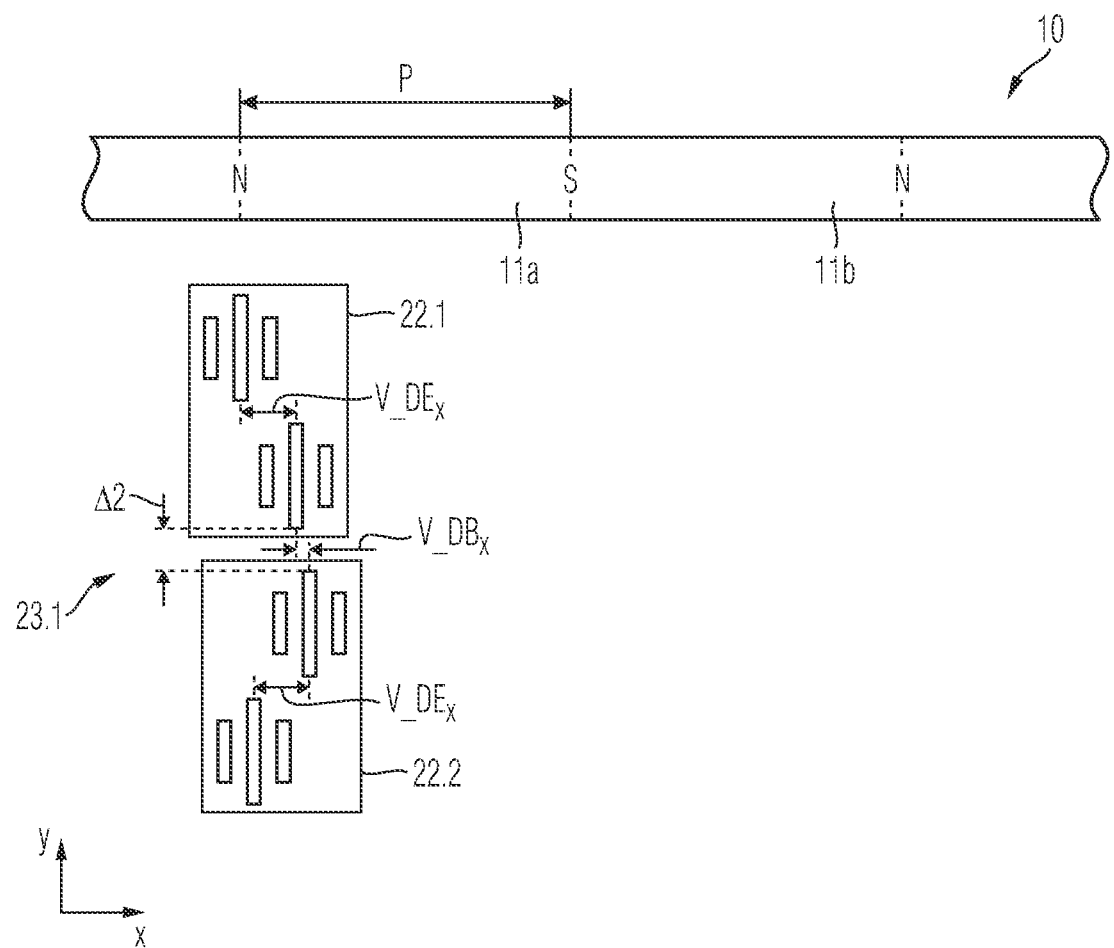
FIG. 5 schematically illustrates the configuration of a detector group in a scanning unit of the magnetic position measuring device.

As schematically illustrated in FIG. 5, the detector system in the scanning unit also has a second detector block 22.2 in addition to first detector block 22.1. Second detector block 22.2 substantially has an identical configuration to that of first detector block 22.1 and also includes two detector unit cells, which have a certain relative position with respect to each other.

Second detector block 22.2 is placed in a certain relative position with respect to first detector block 22.1 in the detector system. For example, the second detector block is arranged at an offset by measuring-direction offset amount $V\_DB_x=P/22$ in relation to first detector block 22.1 along measuring direction x. Additionally, perpendicular to measuring direction x, second detector block 22.2 is arranged at an offset by transverse offset amount $V\_DB_y=L\_DB_y+\Delta2$ in relation to first detector block 22.1. Variable $\Delta2$ is, for example, selected to be in a range between 10 µm and 100 µm.

Via the two detector blocks 22.1, 22.2, a first detector group 23.1, which is configured to filter the third, fifth, seventh, ninth, and eleventh harmonics from the scanning signals, is provided in this exemplary embodiment.

All detector elements of first detector group 23.1 are connected in series in the scanning unit. In case of a relative movement of scale 10 and the scanning unit, a first periodic partial incremental signal, which is denoted below by S_0, is able to be generated.

Figure 6:
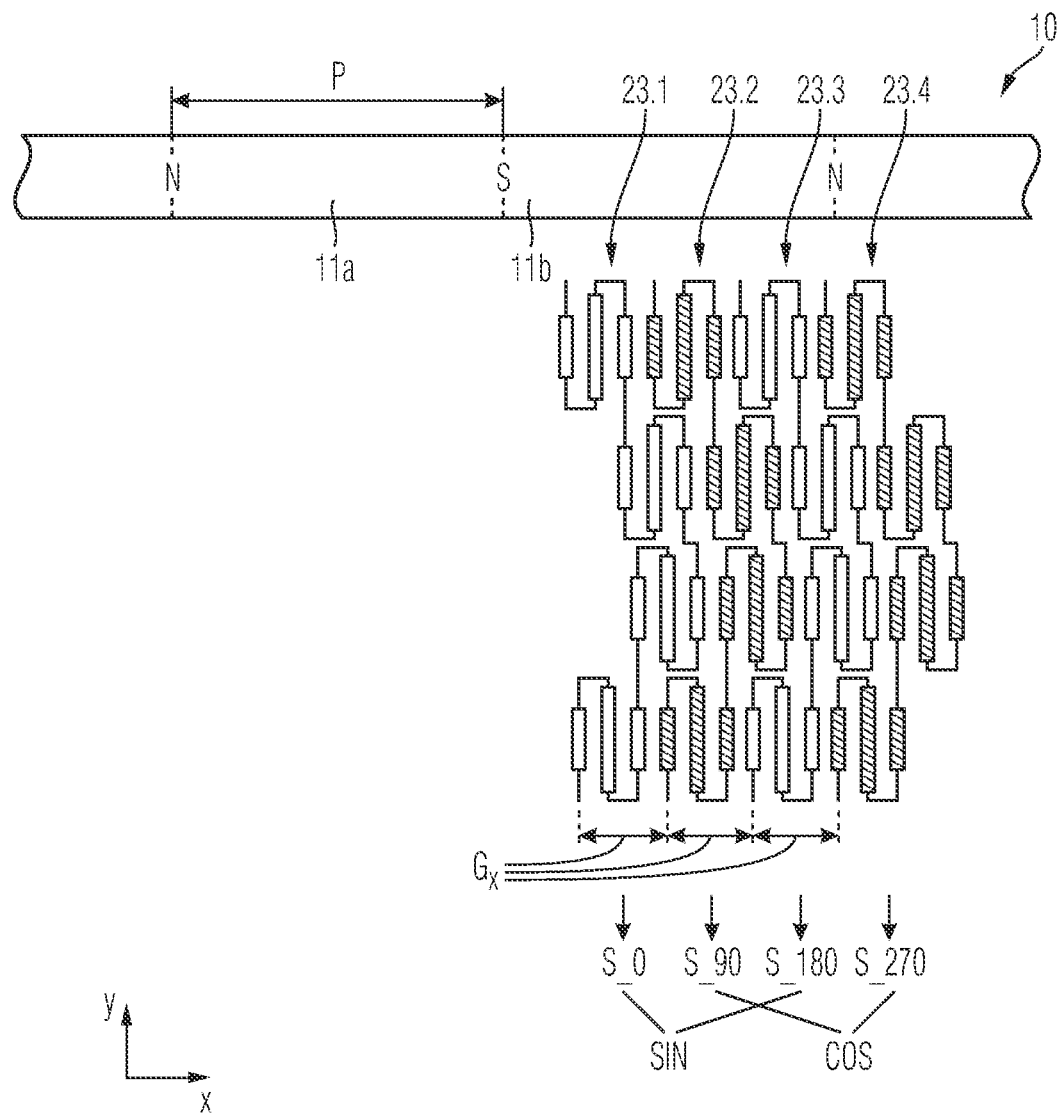
FIG. 6 schematically illustrates a system having multiple detector groups in a scanning unit of the magnetic position measuring device.

In order to be able to supply incremental signals that are offset in phase by 90° to sequential electronics downstream from the magnetic position measuring device, the detector system illustrated in FIG. 5 may be expanded even further. A corresponding variant of such a detector system is schematically illustrated in FIG. 6. FIG. 6 also illustrates the connection lines that interconnect the detector elements in series within a detector group. For example, these may be arranged as copper lines between the Permalloy layer stripes of the detector elements.

In addition to first detector group 23.1, according to the example illustrated in FIG. 5, the detector system illustrated in FIG. 6 also includes a further three detector groups 23.2 to 23.4, which substantially have the same configuration as first detector group 23.1.

A second detector group 23.2 is arranged along measuring direction x at a distance $G_x=P/4$ from first detector group 23.1. In a relative movement of scale 10 and the scanning unit, it is therefore possible to generate a second periodic partial incremental signal S_90, which has a 90° phase offset in relation to first partial incremental signal S_0, via second detector group 23.2.

Moreover, a third detector group 23.3 is arranged along measuring direction x at a distance $G_x=P/4$ from second detector group 23.2 via which a third periodic partial incremental signal S_180, which has a phase offset of 90° in relation to second partial incremental signal S_90, is able to be generated in case of a relative movement of scale 10 and the scanning unit.

A fourth detector group 23.4 is arranged along measuring direction x at a distance $G_x=P/4$ from third detector group 23.3 in order to generate a fourth periodic partial incremental signal S_270, which has a 90° phase offset in relation to third partial incremental signal S_180, via fourth detector group 23.4 in case of the relative movement of scale 10 and the scanning unit.

In order to generate the two periodic incremental signals having a 90° phase offset required on the part of the sequential electronics from the four partial incremental signals S_0, S_90, S_180, S_270 generated in this manner, it may furthermore be provided that, for example, the first and third detector group 23.1, 23.3 are connected to each other via a half bridge such that the first periodic incremental signal SIN is able to be generated from the first and third partial incremental signal S_0, S_180. Additionally, the second and fourth detector group 23.2, 23.4 are connected to each other via a further half bridge such that the second periodic incremental signal COS, which has a 90° phase offset in relation to first incremental signal SIN, is able to be generated from the second and fourth partial incremental signal S_90, S_270. The corresponding wiring of the detector elements is schematically illustrated in FIG. 6.

As an alternative, the generation of incremental signals SIN, COS is also possible using full bridges, which include two half bridges connected in parallel with each other. To form the full bridges, four further detector groups (23.1', 23.2', 23.3', and 23.4') are provided, which have an identical configuration to that of the first to fourth detector groups according to the described example and are arranged along measuring direction x at an offset of pitch P in relation to the first four detector groups. First incremental signal SIN results from the full-bridge interconnection of groups 23.1, 23.3, 23.1', and 23.3'. Second incremental signal COS, phase-offset by 90°, results from the full-bridge interconnection of groups 23.2, 23.4, 23.2', and 23.4'.

Such a detector system may furthermore be expanded into a matrix of multiple detector groups, which includes columns of multiple detector groups arranged in measuring direction x, and lines having multiple detector groups arranged in the y-direction. For example, a matrix of eight columns and four lines of detector groups may be provided for this purpose.

With the aid of such a detector system, it is possible to achieve even better averaging of the generated scanning signals, and resulting errors attributable to the less than perfect installation of the position measuring device in the individual application can be minimized in this manner.

A further alternative configuration of suitable detector blocks or detector groups in the detector system of the scanning unit of a position measuring device is described in further detail below with reference to FIGS. 7 and 8, focusing on the main differences with respect to the previously-described variants.

Figure 7:
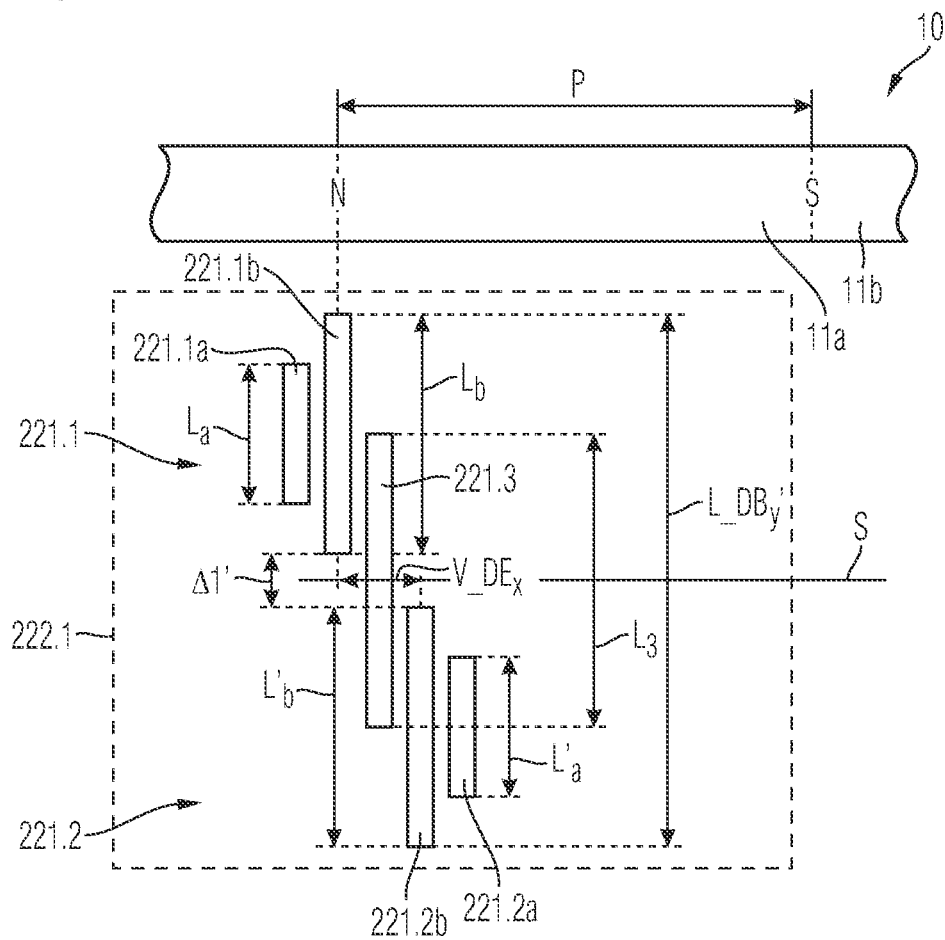
FIG. 7 schematically illustrates the configuration of a detector block in a scanning unit of the magnetic position measuring device.

FIG. 7 schematically illustrates an option for the configuration of a first detector block 222.1 that includes two detector unit cells 221.1, 221.2, the second detector unit cell 221.2 being arranged along measuring direction x at an offset by measuring-direction offset amount $V\_DE_x=P/6$ in relation to first detector unit cell 221.1. It is furthermore provided that one detector element 221.3 is part of both the first and the second detector unit cell 221.1, 221.2. As illustrated in FIG. 7, this is the third detector element from the left in first detector unit cell 222.1, and it is the first detector element from the left in the second detector unit cell. In addition, first and second detector unit cell 221.1, 221.2 also have two further detector elements 221.1a, 221.1b and 221.2a, 221.2b. As a result, first detector block 222.1 illustrated in FIG. 7 has a total of five detector elements 221.1a, 221.1b, 221.3, 221.2a, 221.2b.

As in the above example, the adjacent detector elements of a unit cell 221.1, 221.2 have a distance $D_x=P/12$ along measuring direction x in each case.

In the two detector unit cells 221.1, 221.2, center detector elements 221.1b, 221.2b have the same length, e.g., $L_b=L_b'$ in each case. In the same manner, outermost detector elements 221.1a, 221.2a in the two detector unit cells 221.1, 221.2 have the same length, e.g., $L_a=L_a'$.

The particular detector element 221.3 that is part of both first and second detector unit cell 221.1, 222.2 has length $L_3=2\cdot L_a=2\cdot L_b/\sqrt{3}$ in the illustrated exemplary embodiment.

For first detector block 221.1 illustrated in FIG. 7, a detector block length $L\_DB_y'=2\cdot Lb+\Delta 1'$ thus results along longitudinal direction y of detector elements 221.1a, 221.1b, 221.3, 221.2a, 221.2b, with Δ1' being between 10 μm and 100 μm.

As illustrated in FIG. 7, detector element 221.3, which is part of both first and second detector unit cell 221.1, 221.2, is symmetrically arranged in relation to a center line of symmetry S of first detector block 221.1. The two further detector elements 221.1a, 221.1b of first detector unit cell 221.1 are set apart within the range of between Δ1'/2 and $L\_DB_y'/2$ and are arranged on one side of line of symmetry S. The two further detector elements 221.2a, 221.2b of second detector unit cell 221.2 are set apart within the range of between Δ1'/2 and $L\_DB_y'/2$ and are arranged on the opposite side of line of symmetry S.

With the aid of a first detector block 221.1 arranged in this manner, it is possible to filter out the third, fifth, seventh, and ninth harmonics from the periodic scanning signals. If the eleventh harmonic is to be filtered out as well, then—similar to the above example—the detector system is able to be supplemented by a further, second detector block 222.2 as schematically illustrated in FIG. 8. Second detector block 222.2 substantially has an identical configuration to that of first detector block 222.1. Together with first detector block 222.1, it once again forms a first detector group 223.1 suitable for generating a first partial incremental signal.

Second detector block 222.2 is arranged along measuring direction x at an offset by measuring-direction offset amount $V\_DB_x'=P/22$ in relation to first detector block 222.1. Perpendicular to measuring direction x, second detector block 222.2 is arranged at an offset by transverse offset amount $V\_DB_y=L\_DB_y'+\Delta 2'$ in relation to first detector block 222.1, with Δ2' being between 10 μm and 100 μm.

Figure 8:
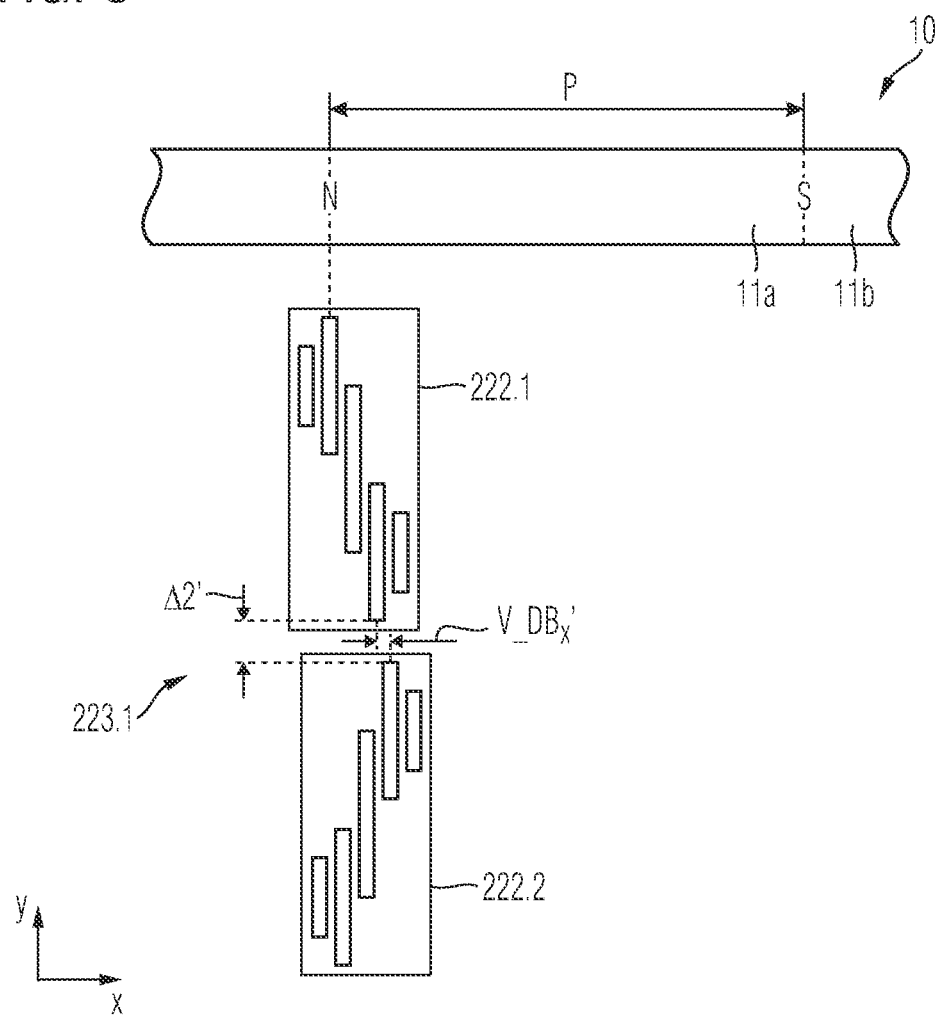
FIG. 8 schematically illustrates the configuration of a detector group in the arrangement illustrated in FIG. 7.

As in the above example, the detector system illustrated in FIG. 8 may also be supplemented by three further detector groups via which three further partial incremental signals are able to be generated. A suitable interconnection of the total of four detector groups makes it possible again to form the two incremental signals SIN, COS offset in phase by 90°.

What is claimed is:

1. A magnetic position measuring device, comprising:
   a magnetic scale; and
   a scanning unit, the magnetic scale and the scanning unit being movable relative to each other in at least one measuring direction;
   wherein the magnetic scale includes scale regions positioned at a regular pitch, representing an extension of the scale region along the measuring direction, and adjacent scale regions having oppositely-oriented magnetizations;
   wherein the scanning unit includes at least one first detector unit cell having three stripe-shaped magnetoresistive detector elements set apart from one another in the measuring direction, a longitudinal direction of each detector element being oriented perpendicular to the measuring direction; and
   wherein adjacent detector elements along the measuring direction in the first detector unit cell have a distance from each other equal to one twelfth of the pitch.

2. The magnetic position measuring device according to claim 1, wherein a center detector element has a length along the longitudinal direction greater than lengths of two outer detector elements.

3. The magnetic position measuring device according to claim 2, wherein the following relationship is satisfied:

$$L_a=L_c=L_b/\sqrt{3};$$

$L_a$ and $L_c$ representing the lengths of the two outer detector elements, $L_b$ representing the length of the center detector element.

4. The magnetic position measuring device according to claim 1, wherein the detector elements are arranged as anisotropic magnetoresistive sensors.

5. The magnetic position measuring device according to claim 1, wherein the detector elements include Permalloy layers having anisotropic magnetoresistance.

6. A magnetic position measuring device, comprising:
   a magnetic scale; and
   a scanning unit, the magnetic scale and the scanning unit being movable relative to each other in at least one measuring direction;

wherein the magnetic scale includes scale regions positioned at a regular pitch, representing an extension of the scale region along the measuring direction, and adjacent scale regions having oppositely-oriented magnetizations;

wherein the scanning unit includes at least one first detector unit cell having three stripe-shaped magnetoresistive detector elements set apart from one another in the measuring direction, a longitudinal direction of each detector element being oriented perpendicular to the measuring direction;

wherein adjacent detector elements along the measuring direction in the first detector unit cell have a distance from each other equal to one twelfth of the pitch;

wherein a center detector element has a length along the longitudinal direction greater than lengths of two outer detector elements;

wherein the following relationship is satisfied:

$$L_a = L_c = L_b/\sqrt{3};$$

$L_a$ and $L_c$ representing the lengths of the two outer detector elements, $L_b$ representing the length of the center detector element;

wherein the scanning unit includes at least one first detector block, which includes the first detector unit cell and a second detector unit cell having an identical configuration as the first detector unit cell, being arranged along the measuring direction at an offset by a first measuring-direction offset amount relative to the first detector unit cell, and, perpendicular to the measuring direction, being arranged at an offset by a first transverse offset amount relative to the first detector unit cell, the first detector block having a detector block length along the longitudinal direction of the director elements; and wherein the following relationships are satisfied:

$$V\_DE_x = P/6;$$

$$V\_DE_y = L_b + \Delta 1; \text{ and}$$

$$L\_DB_y = 2 \cdot L_b + \Delta 1;$$

$V\_DE_x$ representing the first measuring direction offset amount, P representing the pitch, $V\_DE_y$ representing the first transverse direction offset amount, $L\_DB_y$ representing the detector block length, $\Delta 1$ being between 10 μm and 100 μm.

7. The magnetic position measuring device according to claim 6, wherein the scanning unit includes a second detector block having an identical configuration as the first detector block, the first detector block and the second detector block jointly forming a first detector group, the second detector block being arranged along the measuring direction at an offset by a second measuring direction offset amount relative to the first detector block, and, perpendicular to the measuring direction, being arranged at an offset by a second transverse offset amount relative to the first detector block; and wherein the following relationships are satisfied:

$$V\_DB_x = P/22;$$

$$V\_DB_y = L\_DB_y + \Delta 2;$$

$V\_DB_x$ representing the second measuring direction offset amount, $V\_DB_y$ representing the second transverse offset amount, $\Delta 2$ being between 10 μm and 100 μm.

8. The magnetic position measuring device according to claim 7, wherein the detector elements of the first detector group are connected to one another in series, the first detector group being configured to generate a first periodic partial incremental signal in response to relative movement between the magnetic scale and the scanning unit.

9. The magnetic position measuring device according to claim 8, wherein the scanning unit includes at least three further detector groups, each further detector group having an identical configuration as the first detector group;

wherein a second detector group is arranged along the measuring direction at a distance, equal to one quarter of the pitch, from the first detector group and is configured to generate a second periodic partial incremental signal, having a 90° phase offset relative to the first partial incremental signal, in response to relative movement between the magnetic scale and the scanning unit;

wherein a third director group is arranged along the measuring direction at a distance, equal to one quarter of the pitch, from the second detector group and is configured to generate a third periodic partial incremental signal, having a 90° phase offset relative to the second partial incremental signal, in response to relative movement between the magnetic scale and the scanning unit; and wherein a fourth detector group is arranged along the measuring direction at a distance, equal to one quarter of the pitch, from the third detector group is configured to generate a fourth periodic partial incremental signal, having a 90° phase offset relative to the third partial incremental signal, in response to relative movement between the magnetic scale and the scanning unit.

10. The magnetic position measuring device according to claim 9, wherein the first detector group and the third detector group are connected to each other to generate a first periodic incremental signal from the first partial incremental signal and the third partial incremental signal; and wherein the second detector group and the fourth detector group are connected to each other to generate a second periodic incremental signal, having a 90° phase offset relative to the first incremental signal, from the second partial incremental signal and the fourth partial incremental signal.

11. The magnetic position measuring device according to claim 9, wherein the detector elements of at least one of the detector groups are interconnected in series.

12. The magnetic position measuring device according to claim 9, wherein the detector elements of each detector group are interconnected in series.

13. The magnetic position measuring device according to claim 6, wherein the detector elements are arranged as anisotropic magnetoresistive sensors.

14. The magnetic position measuring device according to claim 6, wherein the detector elements include Permalloy layers having anisotropic magnetoresistance.

15. A magnetic position measuring device, comprising:
a magnetic scale; and
a scanning unit, the magnetic scale and the scanning unit being movable relative to each other in at least one measuring direction;

wherein the magnetic scale includes scale regions positioned at a regular pitch, representing an extension of the scale region along the measuring direction, and adjacent scale regions having oppositely-oriented magnetizations;

wherein the scanning unit includes at least one first detector unit cell having three stripe-shaped magnetoresistive detector elements set apart from one another in the measuring direction, a longitudinal direction of each detector element being oriented perpendicular to the measuring direction;

wherein adjacent detector elements along the measuring direction in the first detector unit cell have a distance from each other equal to one twelfth of the pitch; and wherein the scanning unit includes a first detector block, which includes the first detector unit cell and a second detector unit cell, the second detector unit cell being arranged along the measuring direction at an offset by a first measuring direction offset amount relative to the first detector unit cell, a detector element being part of both the first detector unit cell and the second detector unit cell so that the first detector block includes five detector elements; and wherein the following relationship is satisfied:

$$V\_DE_x = P/6;$$

$V\_DE_x$ representing the first measuring direction offset amount, P representing the pitch.

16. The magnetic position measuring device according to claim 15, wherein center detector elements of the first and second detector unit cells have a same length;

wherein outermost detector elements of the first and second detector unit cells have a same length; and the detector element that is part of both the first and the second detector unit cell has a length in the longitudinal direction that satisfies the following relationship:

$$L_3 = 2 \cdot L_a = 2 \cdot L_b / \sqrt{3};$$

$L_3$ representing the length in the longitudinal direction of the detector element that is part of both the first and the second detector unit cell, $L_a$ representing the length of the outermost detector elements of the first and second detector unit cells, $L_b$ representing the length of the center detector elements of the first and second detector unit cells.

17. The magnetic position measuring device according to claim 16, wherein the first detector block has a detector block length along the longitudinal direction of the detector elements that satisfies the relationship:

$$L\_DB_y' = 2 \cdot L_b + \Delta 1';$$

$L\_DB_y'$ representing the detector block length of the first detector block along the longitudinal direction of the detector elements, $\Delta 1'$ being between 10 μm and 100.

18. The magnetic position measuring device according to claim 17, wherein the detector element that is part of both the first detector unit cell and the second detector unit cell is arranged in symmetry with a center line of symmetry of the first detector block;

wherein the center and outermost detector elements of the first detector unit cell are set apart between $\Delta 1'/2$ and $L\_DB_y'/2$ and are arranged on one side of the line of symmetry; and wherein center and outermost detector elements of the second detector unit cell are set apart between $\Delta 1'/2$ and $L\_DB_y'/2$ and are arranged on an opposite side of the line of symmetry.

19. The magnetic position measuring device according to claim 18, wherein the scanning unit includes a second detector block having an identical configuration as the first detector block, the first detector block and the second detector block jointly form a first detector group, the second detector block being arranged along the measuring direction at an offset by a second measuring direction offset amount relative to the first detector bock and, perpendicular to the measuring direction, being arranged at an offset by a transverse offset amount relative to the first detector block; and wherein the following relationships are satisfied:

$$V\_DB_x' = P/22; \text{ and}$$

$$V\_DB_y = L\_DB_y' + \Delta 2';$$

$V\_DB_x'$ representing the second measuring direction offset amount, $V\_DB_y$ representing the transverse offset amount, $\Delta 2'$ being between 10 μm and 100 μm.

20. The magnetic position measuring device according to claim 19, wherein the detector elements of at least one of the detector groups are interconnected in series.

21. The magnetic position measuring device according to claim 19, wherein the detector elements of each detector group are connected in series.

22. The magnetic position measuring device according to claim 15, wherein the detector elements are arranged as anisotropic magnetoresistive sensors.

23. The magnetic position measuring device according to claim 15, wherein the detector elements include Permalloy layers having anisotropic magnetoresistance.

* * * * *